United States Patent [19]

Kitamura et al.

[11] Patent Number: 4,794,462
[45] Date of Patent: Dec. 27, 1988

[54] METHOD AND SYSTEM FOR PATCHING AN ORIGINAL AT A DESIRED ANGULAR ORIENTATION ON A SCANNER INPUT DRUM OR AN ORIGINAL PATCHING SHEET AND EXTRACTING ORIGINAL TRIMMING DATA

[75] Inventors: Hideaki Kitamura, Osaka; Mitsuhiko Yamada, Kyoto, both of Japan

[73] Assignee: Dainippon Screen Mfg. Co., Ltd., Japan

[21] Appl. No.: 822,889

[22] Filed: Jan. 27, 1986

[30] Foreign Application Priority Data

Apr. 11, 1985 [JP] Japan ................ 60-75411

[51] Int. Cl.⁴ ............. H04N 1/06; H04N 1/00; H04N 1/04
[52] U.S. Cl. ................ 358/289; 358/256; 358/285
[58] Field of Search .......... 358/256, 280, 285, 287, 358/289, 290, 291, 293

[56] References Cited

U.S. PATENT DOCUMENTS

| | | | |
|---|---|---|---|
| 4,535,365 | 8/1985 | Sakamoto | 358/287 |
| 4,591,904 | 5/1986 | Urabe et al. | 358/287 |
| 4,622,591 | 11/1986 | Katsuyama et al. | 358/256 |
| 4,673,989 | 6/1987 | Yamada et al. | 358/287 |
| 4,679,155 | 7/1987 | Mitsuka | 358/256 |
| 4,705,390 | 11/1987 | Kasahara et al. | 355/52 |

FOREIGN PATENT DOCUMENTS

| | | | |
|---|---|---|---|
| 55-21033 | 2/1980 | Japan . | |
| 57-24943 | 2/1982 | Japan | 358/285 |
| 59-197040 | 11/1984 | Japan . | |
| 60-67946 | 4/1985 | Japan | 358/289 |
| 60-67945 | 5/1985 | Japan | 358/289 |
| 60-78448 | 5/1985 | Japan | 358/289 |
| 60-79355 | 5/1985 | Japan | 358/289 |

Primary Examiner—John W. Shepperd
Assistant Examiner—Randall S. Svihla
Attorney, Agent, or Firm—Ostrolenk, Faber, Gerb & Soffen

[57] ABSTRACT

At least one original is patched on an input drum of a scanner or an original patching sheet to be mounted on the input drum at a desired angular orientation as a function of location data describing the location of a trimming frame on a layout sheet and the portion of the original to be patched on the trimming frame. The trimming frame corresponds to a desired scanning region of the original.

3 Claims, 3 Drawing Sheets

METHOD AND SYSTEM FOR PATCHING AN ORIGINAL AT A DESIRED ANGULAR ORIENTATION ON A SCANNER INPUT DRUM OR AN ORIGINAL PATCHING SHEET AND EXTRACTING ORIGINAL TRIMMING DATA

BACKGROUND OF THE INVENTION

This invention relates to a method and system for patching at least one original on an input drum of a plate-making scanner or an original-patching sheet to be mounted on the input drum, and also to a method and system for determining the location of a trimming frame, which corresponds to a desired region located in the original and to be scanned by the scanner, on the input drum or the original-patching sheet to be mounted on the input drum.

When making a printing plate, it is often necessary to trim an image of a major or minor portion of an original, which is composed of one or more sheets of pictures or the like, by designating the size and shape of the image and then to patch the image at a desired location and angle in accordance with a designated layout so as to form an assembled image.

A layout scanner is provided with the ability to rotate each input image. However, the resolution of the image is reduced when it is rotated. Moreover, most scanners are not equipped with an image-rotating function. When placing an original on a scanning drum, it is therefore desireable to patch the original at a desired angle and then to subject same to photoelectric scanning.

As a method for patching an original on an input drum (which may also be called cylinder) of a scanner at a desired angle, reference may be made to Japanese Patent Laid-Open (Kokai) No. 55-21033.

According to the method disclosed in the above referred-to Japanese patent publication, an image of an original is projected on a layout sheet on which a designated layout has been drawn in advance. The magnification of the image is adjusted and the layout sheet is shifted so that a desired duplicate region of the projected image of the original is fit in both size and angle in a trimming frame on the layout sheet which trimming frame has been designated for the image of the original. A reference line corresponding to the inclination of the layout sheet at that time is marked in a margin of the original or on an auxiliary tab attached to the original. By bringing a line located horizontally on the input drum and the reference line on the original into registration when patching the original onto the input drum, the original can be patched at the desired angle.

The above method has, however, several drawbacks. It requires an additional step of drawing the reference line on the original and it is difficult to patch the original accurately at the desired angle because the original is patched by eye measurement relying upon a short reference line.

With a view toward solving the above drawbacks, the present applicant has disclosed in Japanese Patent Laid-Open (Kokai) No. 59-197040 a method for patching an original accurately on an input drum without the need for drawing a reference line on the original.

Even with the above-mentioned improved method, it is still difficult to determine the accurate location of a trimming frame for an original on an input drum.

An object of this invention is therefore to provide a method and system for patching at least one original at a desired angle on an input drum of a scanner or an original-patching sheet to be mounted on the input drum in accordance with a layout sheet and for determining the location of a trimming frame for the original, which trimming frame corresponds to a desired scanning region of the original, with high accuracy.

In one aspect of this invention, there is thus provided a method for patching an original and extracting original-trimming data in a scanner, said method comprising the steps of:

mounting a layout sheet on a digitizer;

utilizing the digitizer to determine location data concerning trimming frames for each of at least one pattern located on a layout sheet and location data of a rectangular region circumscribing the trimming frame and corresponding to an area to be trimmed, storing these location data in a memory device, and reading out the location data of the trimming frame for the pattern from the memory device and displaying trimming lines for the pattern on a monitor;

picking up an original by means of a pick-up device, adjusting the angle, location and pick-up magnification of the original so as to display a desired duplicate portion of the original in such a way that the desired duplicate portion is fit in the trimming frame for the pattern;

calculating the location data of the rectangular region, which corresponds to the trimmed area of the original, on the original from the location data of the rectangular region corresponding to the trimmed area of the original and the pick-up magnification, shifting the original by means of an original-holding plate from the pick-up location thereof while maintaining the angle and patching the original on an input drum of the scanner or an original-patching sheet mounted on the input drum, and calculating the location data of the rectangular region, which corresponds to the trimmed area of the original, on the input drum from the distance of displacement of the original-holding plate and the location data of the rectangular region of the original, which region corresponds to the trimmed area of the original, on the original.

In another aspect of this invention, there is also provided a system for patching an original and extracting original-trimming data in a scanner, which comprises:

a digitizer for determining location data of a trimming frame for at least one pattern on a layout sheet, location data of a rectangular region circumscribing the trimming frame and corresponding to an area to be trimmed and data specifying the location of the rectangular region corresponding to the area to be trimmed;

a memory device for storing these location data;

an original-holding plate for holding an original at a desired angle and position;

a pick-up device for picking up the original with a desired magnification;

a monitor for displaying a desired duplicate portion of the image of the original, which image has been picked up by the pick-up device, in the trimming frame for the pattern which frame has been read out from the memory device;

an original-shifting device for shifting the original from the pick-up position by the pick-up device to an input drum of the scanner or an original-patching sheet mounted on the input drum while maintaining the desired angle; and means for detecting the distance of displacement of the original-shifting device.

According to the present invention, upon patching one or more originals directly on an input drum of a scanner or on an original-patching sheet, the originals can respectively be patched at desired angles in accordance with a layout sheet without need for adding of reference points or lines on the originals. Moreover, it is also possible to obtain, with ease, accurate information on the locations of rectangular trimming regions, which correspond to desired scanning portions of the respective originals, and accurate information on the output locations.

BRIEF DESCRIPTION OF THE DRAWINGS

The above and other objects, features and advantages of this invention will become apparent from the following description and appended claims, taken in conjunction with the accompanying drawings, in which:

Embodiments of this invention will hereinafter be described with reference to the accompanying drawings.

DETAILED DESCRIPTION OF THE INVENTION

Figure 1:
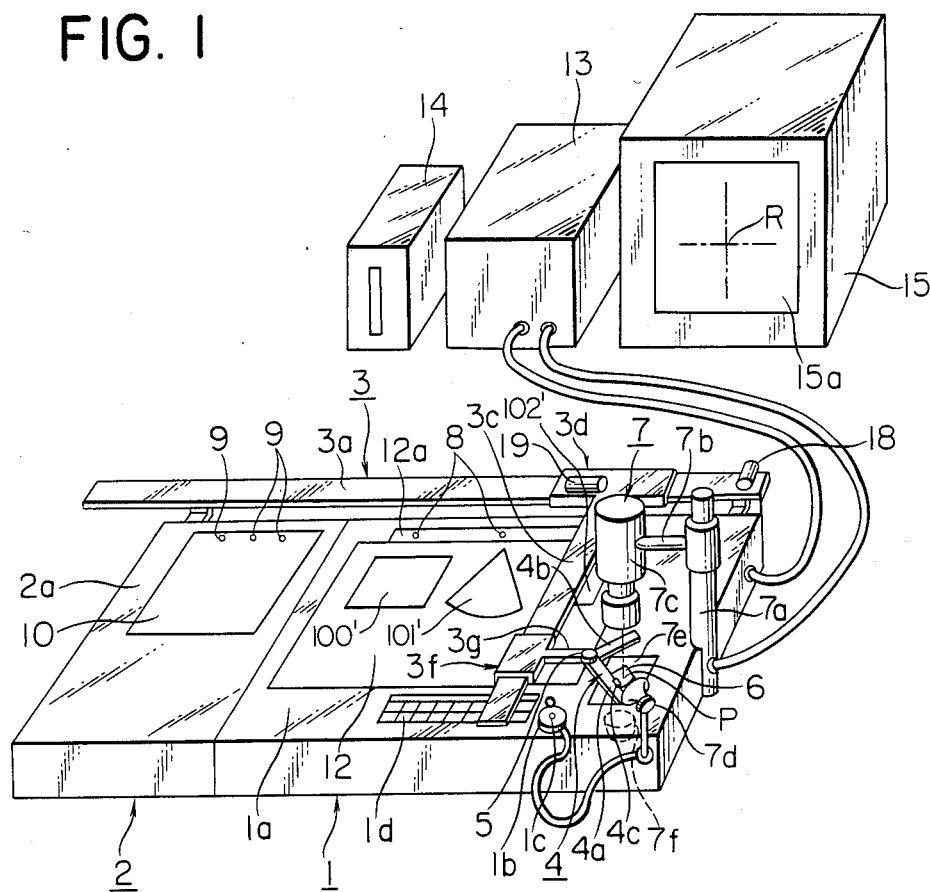
FIG. 1 is a perspective view of an original patching and trimming-data extracting apparatus (hereinafter called "the main unit" for the sake of brevity) in a scanner which is suitable for use in the practice of the method of this invention, in which the apparatus is viewed from a point in front of the apparatus.

Referring first to FIG. 1, an original shifting device 3 extends between a digitizer 1a which defines a coordinate detection unit 1 and a patching table 2a which defines an original patching work area 2. The original shifting device 3 includes a first guide plate 3a which extends adjacent to the upper edge of both the digitizer 1a and patching table 2a and in parallel with the horizontal directions (hereinafter called "X-axes") of the coordinate systems of the digitizer 1a and patching table 2a.

The first guide plate 3a is provided with a first slide member 3d supporting a second guide plate 3c which is slidable at a base portion thereof and which extends at a right angle relative to the first guide plate 3a.

A second slide member 3f is provided on the second guide place 3c and is slidable at a base portion thereof. The slide member 3f is equipped with an arm 3g which, for example, extends rightward as illustrated in the drawing. The arm 3g terminates in an original-holding device 4.

A turning device 5 is provided between the arm 3g and original-holding device 4. The turning device 5 is adapted to turn the original-holding device 4 and is equipped with a clamp means which holds the original-holding device 4 in place at any desired rotary angle.

The original-holding device 4 is provided with a first original-holding plate 4a and a second original-holding plate 4b. Assuming that the reference position of the original-holding device 4 extends in the X-direction, the length of the first original-holding plate 4a extends in the X-direction (horizontal direction) while the length of the second original-holding plate 4b extends in the vertical direction (hereinafter called "the Y-direction") which is perpendicular to the horizontal direction. The second original-holding plate 4b is usually used as auxiliary means and may be omitted in some instances.

An original 6 which is to be patched on to the original patching sheet 10 is temporarily held on the original-holding plates 4a,4b by temporary original-holding means 4c, for example, suction cups, clamps making use of springs or magnets, or as employed in the illustrated embodiment, a releasable adhesive tape, or the like.

The original-shifting device 3 is constructed in such a way that the original 6 held by the original-holding device 4 can be shifted to any region on the patching table 2a as desired, it can also be shifted to the pick-up region of an original pick-up device 7 which will be described herein, and it can be shifted without changing its angle of rotation.

On the rear board of the digitizer 1a, a plurality of registration pins 8 are provided along a straight line which extends in the X-direction of the digitizer 1a.

A plurality of similar registration pins 9 are provided on the patching table 2a, on an extension of the straight line on which the registration pins 8 are arranged or on a line which extends parallel to the straight line. An original patching sheet 10 is brought into engagement with the registration pins 9.

The size of the original patching sheet 10 is determined in accordance with the size of the input drum (which may also be called "input cylinder") 11 (FIGS. 5 and 6) of a scanner to which the sheet 10 is to be attached for scanning. Original patching sheets are usually available in different sizes, i.e., full size, ½, ¼, ⅛ and so on, all relative to the input drum. They thus have sizes corresponding to the diameters of respective input drums.

Figure 6:
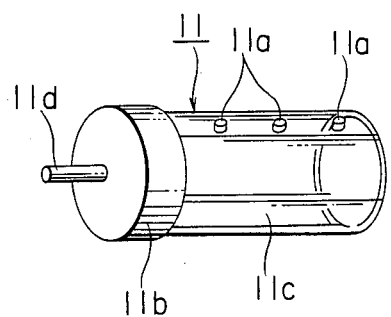
FIG. 6 is a perspective view of an input drum of a scanner.

As illustrated in FIG. 6, the input drum 11 is equipped with registration pins 11a which correspond to the registration pins 9. The input drum 11 is also formed of a cylindrical metal portion 11b, a transparent cylindrical resin portion 11c attached to the metal portion 11b, and a drum shaft 11d.

Figure 2:
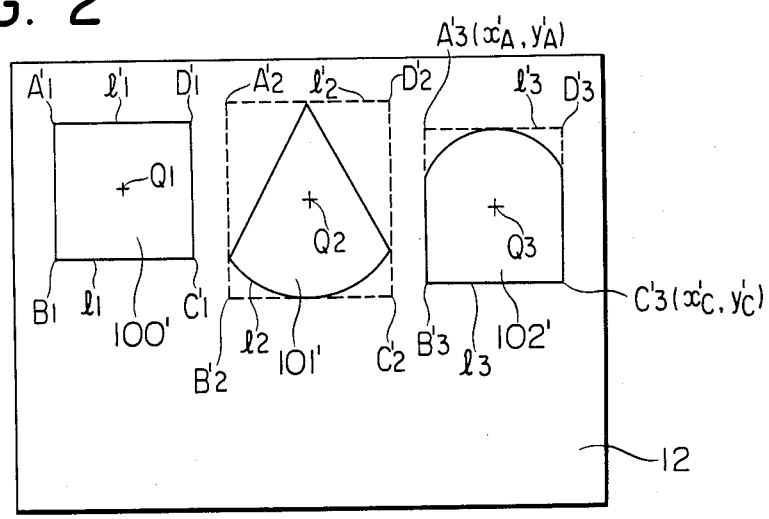
FIG. 2 is a plan view illustrating one example of a layout sheet.

As shown by way of example in FIG. 2, trimming frames 1'1, 1'2, 1'3 (designated generally as l) showing the desired locations of the reproduced originals on the original patching sheet 10 have been pre-drawn on the layout sheet 12. Each trimming frame fits within a corresponding rectangular trimming region l'1, l'2, l'3 (designated generally as l') which closely borders trimming frames l. The central point of each trimming region l' is located at points Q1,Q2, Q3 (designated generally as Q). By storing the points Q and the size and shapes of the trimming regions l' their desired position on the patching sheet 10 can be accurately known.

Since the layout sheet 12 is generally drawn on a relatively thick drafting paper, an auxiliary paper tab 12a (FIG. 1) may in some instances be attached to fix the layout sheet 12 at a prescribed position on the digitizer 1a by means of the registration pins 8.

When the auxiliary paper tab 12a is applied, its position of attachment to the layout sheet 12 is accurately determined by means of a jig or the like in view of its position relative to the registration pins 8 so that as a rule, the X and Y axes on the layout sheet 12 are allowed to extend parallel with the X- and Y-axes of the digitizer 1a, respectively.

The layout sheet 12 is maintained in engagement with the registration pins 8 provided behind the digitizer 1a in order to input data on the trimming frames 1 of the patterns, data on the corresponding rectangular trimming regions 1' and data on the central points Q of the corresponding rectangular trimming region.

The digitizer 1a is provided with a digitizer cursor 1b which is used to designate, on the digitizer 1a, points to be input. The digitizer cursor 1b is generally provided with a push button switch 1c. By pushing the push button switch 1c, it is possible to obtain coordinate data concerning the location of the cursor 1b relative to the digitizer 1a at the instant the switch 1c is depressed.

A magnification lens (not shown) may be mounted on the digitizer cursor 1b so as to improve the accuracy of the coordinate data identifying the location and shape of the pattern trimming frame 1.

The illustrated system is designed in such a way that coordinate data, which have been output from the digitizer 1a, are input in a computer 13. The computer 13 is connected to a memory device 14 which makes use of a floppy disk or the like as a recording medium and also to a color monitor 15 which is employed to display images.

An original pick-up device 7 is provided, for example, at the right front portion of the digitizer 1a. The original pick-up device 7 is composed of a post 7a provided upright in the vicinity of a side edge portion of the digitizer 1a and a television camera 7c provided at an upper portion of the post 7a by means of a support member 7b.

The television camera 7c has a zoom lens so that its pick-up magnification can be controlled from an control panel (not shown). Needless to say, the pick-up magnification may also be adjusted manually. The pick-up magnification is input in the computer 13 or memory device 14 and at the same time is displayed by suitable means (not shown).

The optical axis of the television camera 7c is adjusted, as a rule, in such a way that the central point P of a pick-up region 7e is displayed at the central point R of the screen 15a of the monitor 15. In addition, the X- and Y-axes of the picked-up image are, as a rule, aligned parallel to the coordinate axes of the digitizer 1a and patching table 2a.

The pick-up region (corresponding in location to the diffusion plate 7e) which centers at the point P and is to be picked up by the television camera 7c is illuminated by either one or both of an illuminating light 7d for a reflected image of the original or an illuminating light 7f for a transmitted image of the original. The latter light 7f is provided underneath a diffusion plate 7e which generally lies in the same plane as the board of the digitizer 1a.

In front of the digitizer 1a, there is provided a control menu keyboard 1d which designates the work mode of the digitizer 1a and desired one or more commands to the computer 13 by the digitizer cursor 1b.

A description will hereinafter be made on a method for effecting the patching of the original 6 on the input drum 11 or the original-patching sheet 10 and determining the location data of a corresponding rectangular trimming region 1', which is a desired scanning region of the original 6, on the input drum 11, both by using the main unit shown in FIG. 1.

As prerequisites, the associated devices should have the following functions which are all available in accordance with the known technology.

(1) The memory device 14 should store the location data of the trimming frames 1 for each the patterns illustrated on the layout sheet 12 and should have sufficient data quantity that the trimming frame 1 of each pattern can be displayed fully on the screen 15a of the monitor 15. When it is desired to see the whole layout sheet 12, the data are compressed by calculation or the like and are then displayed.

(2) Pattern trimming lines, which are displayed on the monitor 15, should to have a luminance or color different from the image of the picked-up original 6 so that the trimming lines can be distinguished from the image. Alternatively, the image of the picked-up original 6 may be displayed only within the trimming frames 1 for the respective patterns and the remaining regions may be masked to avoid display of the image there. Further, the dimensions of each trimming frame 1 to be displayed should to be settable at desired magnifications (for this purpose, use of a COMTEC DS-301A monitor manufactured by DAIKIN INDUSTRIES, LTD. may be recommended).

Figure 3:
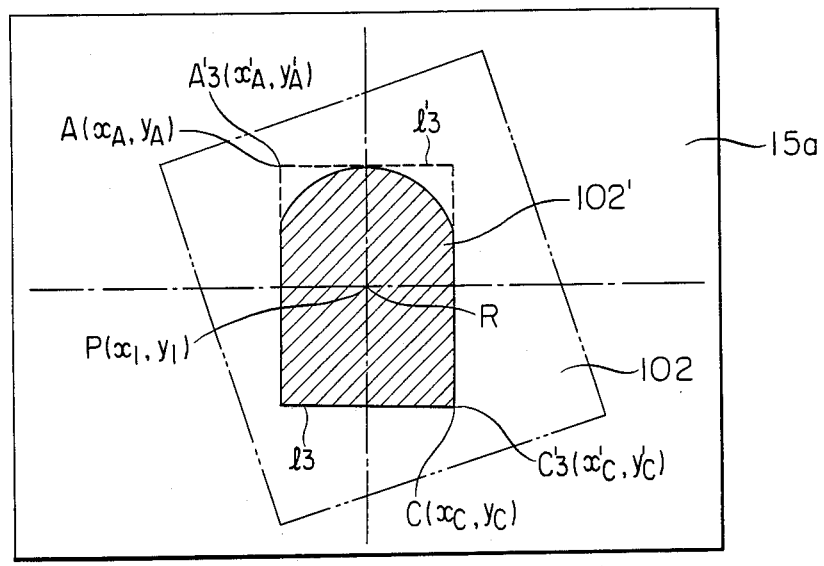
FIG. 3 illustrates by way of example trimming pattern frames and picked-up images of their corresponding originals, both, displayed in an overlapping fashion on a color monitor.

(3) As depicted in FIG. 3, a cursor formed by two mutually-crossing lines should be displayed in a brightness or color distinguishable from each displayed image, for example, near the center of the screen 15a of the monitor 15 when positioning the corresponding rectangular trimming region 1' of each pattern on the layout sheet 12, in other words, for bringing the central point Q of the corresponding rectangular trimming region 1' of each pattern into registration with the cursor.

(4) It is convenient to design the memory device 14 in such a way that images of the original picture 6, which images are to be fit in their corresponding trimming frames 1 on the screen 15a of the monitor 15, can be stored so that the images fit in to their corresponding pattern trimming frames 1 can be observed and the overall image of the layout sheet 12 can thus be obtained.

(5) When it is desired to obtain data on a trimming frame 1 for a circle on the layout sheet 12, data on the central point of the circle and one point on the circumference of the circle (or on the radius of the circle) are input in the computer 13 and the trimming frame can be obtained by using a commercial program. When it is desired to obtain data on a trimming frame for a regular polygon, the computer 13 is fed with data on both ends of one of the sides of the polygon and information on which side (for example above or below) the regular polygon is formed and the trimming frame can also be obtained by using a commercial program.

Turning back to the practice of the method of this invention by means of the system shown in FIG. 1, the layout sheet 12 is first fixed on the digitizer 1a by mounting the auxiliary tab 12a on the registration pins 8 and a reference point (for example, O' shown in FIG. 4) of the layout sheet 12 is input by means of the digitizer cursor 1b.

Utilizing the keyboard 1d and the cursor 1b, the data on the trimming frame $l_1$ for one of the patterns on the layout sheet 12 are input into computer 13. This procedure is repeated for each of the trimming frames ($l_1$–$l_3$) for all the patterns.

In response to information input into the keyboard 1d by the operator, the whole area of the layout sheet 12 is displayed on the color monitor 15. This operation is required to have the overall image of the layout sheet 12 but may thereafter be omitted. It is preferable, however, to always display this information on an additional color monitor (not shown).

The trimming frame $l_1$ for the first pattern 100' is displayed with a desired size (magnification: m times) on the color monitor 15 by designating the number of the first pattern 100' on the keyboard 1d. An image of the first original 6, which image has been picked up with a desired magnification (n times) by means of the television camera 7c, is then displayed only within or overlapping the trimming frame $l_1$. The pick-up (reproduction) magnification of the camera 7c and the angular orientation and position of the original 6 held on the original-holding device 4 are adjusted so that the desired portion of the original is reproduced with the desired positioning within the trimming frame $l_1$. (In FIG. 3, the desired duplicate portion of the original 6 is, by way of example, fit in the trimming frame $l_3$ for the third pattern 102'.)

Incidentally, where the reproduced images magnification (n/m times) has been set beforehand, it is only necessary to adjust the angle and location of the original 6.

It is preferable to displsy the trimming frames 1 for the respective patterns as large as possible on the screen 15a of the color monitor 15, since the accuracy with which they are positioned increases as the sizes of the displayed trimming frames become larger. It is also preferable to use a high-resolution color monitor as the monitor 15.

By fitting the desired reproduced of the original 6 in the corresponding pattern trimming frames 1 in the above-described manner, the location data of the corresponding rectangular trimming regions 11 on the original 6 can be calculated, from the location data of two points on the diagonal extending between the upper left corner and lower right corner of the corresponding rectangular trimming region l' for each pattern [for example, $A_3'(X_A', Y_A')$, $C_3'(X_C', Y_C')$] and the duplicate magnification (n/m), as follows:

$$x_A = \left( x_1 - \frac{x_C' - x_A'}{2} \right) \times \frac{m}{n}, \tag{1}$$

$$y_A = \left( y_1 - \frac{y_C' - y_A'}{2} \right) \times \frac{m}{n}$$

$$x_C = \left( x_1 + \frac{x_C' - x_A'}{2} \right) \times \frac{m}{n}, \tag{2}$$

$$y_C = \left( y_1 + \frac{y_C' - y_A'}{2} \right) \times \frac{m}{n}$$

provided that the coordinate of the central point P of the pick-up region for the origin O is $(x_1, y_1)$.

By shifting the original-holding device 4, the original 6 which has been located in the pick-up region 7e is moved onto the original-patching sheet 10 while maintaining the angular orientation of the original. The original 6 is then patched at a suitable location by means of an adhesive tape or the like.

Figure 4:
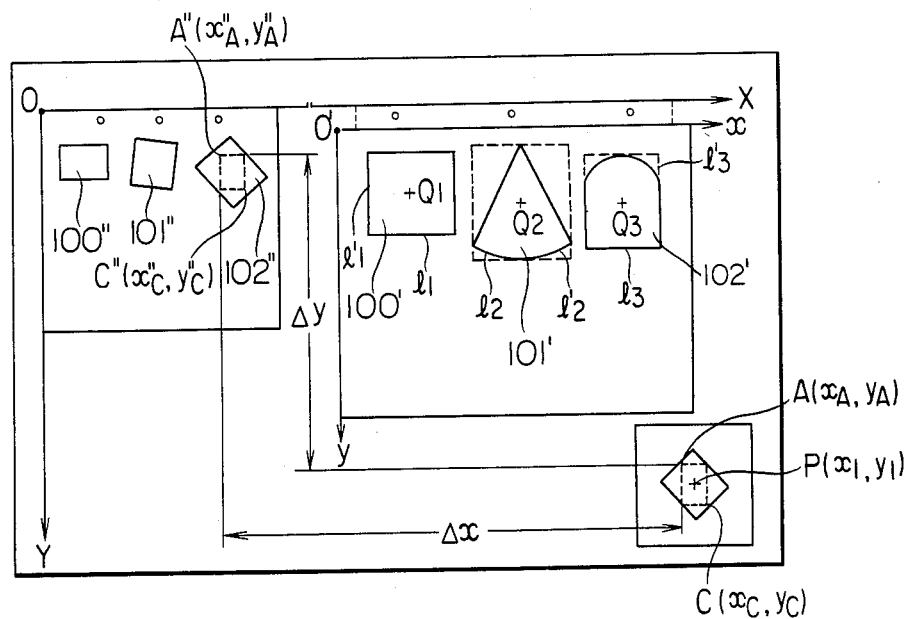
FIG. 4 is a plan view showing the principle of coordinate transformation (correction) for obtaining location data of a rectangular trimming region of an original patched on an original-patching sheet.

A description will next be made on a method for determining the location data $[A''(x_A'',y_A''), C''(x_C'',y_C'')]$ of the corresponding rectangular trimming region 11 of the thus-patched original 6 (see FIG. 4).

Since the origin (O) of the original-patching sheet 10 and the origin of the pick-up region 7e have been set to be equal (if their origins are different, it is only necessary to correct the origins by the degrees of displacement of the corresponding coordinate axes), the location data of each corresponding rectangular trimming region 11 of the original 6 on the original-patching sheet 10 can be determined by correcting the above-calculated location data in view of the degree of displacement of the original-holding device 4.

Namely, by reading the X-fraction and Y-fraction of the displacement of the original 6 from the degrees of displacement $(\Delta x, \Delta y)$ of rotary encoders 18,19, the location data of the corresponding rectangular trimming region (i.e., the region to be scanned on the input drum of the scanner) of the original 6 can be calculated in accordance with the following equations:

$$x_A'' = \left( x_1 - \frac{x_C' - x_A'}{2} \times \frac{m}{n} \right) - \Delta x, \tag{3}$$

$$y_A'' = \left( y_1 - \frac{y_C' - y_A'}{2} \times \frac{m}{n} \right) - \Delta y$$

$$x_C'' = \left( x_1 + \frac{x_C' - x_A'}{2} \times \frac{m}{n} \right) - \Delta x, \tag{4}$$

$$y_C'' = \left( y_1 + \frac{y_C' - y_A'}{2} \times \frac{m}{n} \right) - \Delta y$$

The location data of the corresponding rectangular trimming regions 11 of the original on the input drum 11 can thus be determined since the origin of the input drum 11 and the origin of the original-patching sheet 10 are designed to match, as a rule, by mounting the original-patching sheet 10 on the registration pins 11a of the input drum 11. Such calculation of locations may be performed by using the computer 13 or a desk-top electronic calculator.

By repeating the above-described procedure, at least one original 6 is patched on the original-patching sheet 10 while ensuring that the originals do not overlapped and at the same time, the location data of the corresponding rectangular trimming regions 11 for said at least one original 6 are determined. Even when the origin of the input drum 11 is not in registration with the origin of the original-patching sheet 10, the location data of the corresponding rectangular trimming regions of the original on the input drum 11 can still be determined so long as the coordinate axes of the input drum 11 are set parallel to the corresponding coordinate axes of the original-patching sheet 10 and the degrees of displacement between these coordinate axes are corrected respectively.

Figure 5:
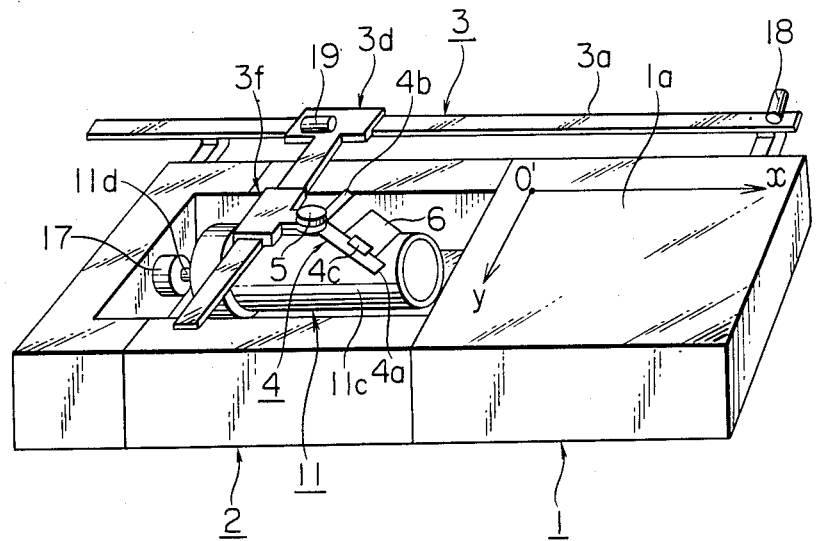
FIG. 5 shows another embodiment of the original patching and trimming-data extracting apparatus illustrated in FIG. 1.

FIG. 5 illustrates the second embodiment of the main unit. The main unit of the second embodiment is useful when patching the original 6 directly on the input drum 11. Its construction is the same as the main unit of the first embodiment depicted in FIG. 1 except for the original patching work area 2. Therefore, FIG. 5 illustrates primarily the different portion and the remaining same portions are mostly omitted in the drawing.

In order to have the upper surface of an input drum 11 lie in the same plane as the diffusion plates 7e of the main unit even when the diameter of the input drum 11 to be mounted on a journal 17 varies, the journal 17 has a vertically-movable structure. A rotary encoder (not illustrated) is connected to the journal 17, whereby the degree of rotation required for the calculation of the degree of circumferential displacement of the input drum 11 can be measured.

When the original 6 is directly patched on the input drum 11 in this embodiment, the location data of each corresponding rectangular trimming region of the original can be determined in the same manner as in the first embodiment shown in FIG. 1 so long as the X-axis is concerned. Since the input drum 11 is rotated from the location of the origin O as a rule when the original 6 is patched, the location data in the direction of the Y-axis can be obtained by correcting them with a value obtained by converting the degree of the rotation into a circumferential length. Namely, representing the degree of displacement of the rotary encoder by $\theta$, the location data of the rectangular trimming region in the direction of the Y-axis can be calculated as follows:

$$y_A'' = \left(y_1 - \frac{x_C' - x_A'}{2} \times \frac{m}{n}\right) - \Delta y + k\theta \quad (5)$$

$$y_C'' = \left(y_1 + \frac{x_C' - x_A'}{2} \times \frac{m}{n}\right) - \Delta y + k\theta \quad (6)$$

wherein k means a constant for converting each degree of rotation of the input drum 11 into its corresponding circumferential length in accordance with the diameter of the drum.

In accordance with the above-determined location data of each region on the input drum 11 which region is to be scanned, the scanner scans the original and outputs picture signals corresponding to the region.

As has been described above, the present invention makes it possible to patch one or more originals at desired angles based on a layout sheet without need for addition of reference points or lines on the originals upon patching the originals directly on the input drum of a scanner or on an original-patching sheet and moreover, to obtain accurate information on the locations of corresponding rectangular trimming regions of the originals which trimming regions are to be scanned.

Having now fully described the invention, it will be apparent to one of ordinary skill in the art that many changes and modifications can be made thereto without departing from the spirit or scope of the invention as set forth herein.

We claim:

1. A method for patching an original and extracting original trimming data in a scanner, said method comprising the steps of:
    mounting a layout sheet on a digitizer;
    utilizing said digitizer to determine location data of a trimming frame and a corresponding rectangular trimming region on the layout sheet, the rectangular trimming region circumscribing the trimming frame and corresponding to an area of an original to be trimmed;
    storing the determined location data of the trimming frame and the rectangular trimming region and displaying the trimming frame on a monitor;
    reproducing an image of an original positioned at a pick-up location on the monitor;
    adjusting the angular orientation and position of the original at the pick-up location and adjusting the reproduction magnification at which the original is reproduced on the monitor so as to display a desired portion of the original on the monitor whereby the desired portion of said original may be fitted within said trimming frame;
    calculating location data of a rectangular region on the original corresponding to the area of the original to be trimmed from the location data of the rectangular trimming region on the layout sheet corresponding to the area of the original to be trimmed and the adjusted reproduction magnification;
    moving the original from the pick-up location to an input drum of a scanner or an original patching sheet to be mounted on an input drum of a scanner while maintaining the angular orientation of the original unchanged;
    patching the original on the input drum of the scanner or on an original patching sheet; and
    calculating location data of a rectangular region on the input drum corresponding to the area of the original to be trimmed from displacement data representing the distance the original was moved from the pick-up location and the location data of the rectangular region on the original corresponding to the area of the original to be trimmed.

2. A system for patching an original and extracting original trimming data in a scanner, said system comprising:
    a digitizer for determining location data of a trimming frame and a corresponding rectangular trimming region on a layout sheet, the rectangular trimming region circumscribing the trimming frame and corresponding to an area of an original to be trimmed;
    a memory device for storing the location data;
    an original-holding plate for holding an original at an adjustable angular orientation;
    an original-shifting device for holding the original-holding plate at an adjustable position;
    a pick-up device for developing an electronic representation of the original with an adjustable magnification when the original is positioned at a pick-up location; and
    a monitor coupled to said pick-up device and said memory device for displaying the trimming frame as a function of the stored location data and for displaying an image of a desired portion of the original relative to be displayed trimming frame as a function of the electronic representation;
    said original-holding plate and said original-shifting device enabling the original to be positioned at a desired angular orientation and position at the pick-up location so that the image of the desired portion of the original is fitted within the displayed trimming frame on the monitor when the pick-up device develops the electronic representation of the original with a desired magnification, and said original-shifting device enabling the original to be moved from the pick-up location to an input drum of a scanner or an original patching sheet to be mounted on an input drum of a scanner while maintaining the desired angular orientation of the original unchanged;
    said system further comprising means for detecting the distance the original-shifting device is moved from the pick-up location.

3. The system according to claim 2, wherein the pick-up device is a television camera.

* * * * *